United States Patent
Gabl

(10) Patent No.: US 9,455,397 B2
(45) Date of Patent: Sep. 27, 2016

(54) STACKABLE PIEZOELECTRIC ACTUATOR COMPONENT

(75) Inventor: Reinhard Gabl, Kufstein (AT)

(73) Assignee: EPCOS AG, Munich (DE)

( * ) Notice: Subject to any disclaimer, the term of this patent is extended or adjusted under 35 U.S.C. 154(b) by 774 days.

(21) Appl. No.: 13/880,037

(22) PCT Filed: Oct. 18, 2011

(86) PCT No.: PCT/EP2011/068195
§ 371 (c)(1),
(2), (4) Date: Jul. 1, 2013

(87) PCT Pub. No.: WO2012/052442
PCT Pub. Date: Apr. 26, 2012

(65) Prior Publication Data
US 2013/0270968 A1      Oct. 17, 2013

(30) Foreign Application Priority Data
Oct. 19, 2010   (DE) .................. 10 2010 048 880

(51) Int. Cl.
  *H01L 41/047*  (2006.01)
  *H01L 41/083*  (2006.01)
(52) U.S. Cl.
  CPC ....... *H01L 41/0475* (2013.01); *H01L 41/0472* (2013.01); *H01L 41/083* (2013.01)
(58) Field of Classification Search
  USPC ........................................ 310/311, 328, 366
  See application file for complete search history.

(56) References Cited

U.S. PATENT DOCUMENTS

| 3,349,259 A | * | 10/1967 | Kistler ........................ 310/338 |
| 5,686,777 A | * | 11/1997 | Chang ........................ 310/326 |
| 2006/0214541 A1 | | 9/2006 | Tsuzuki et al. |
| 2011/0248607 A1 | | 10/2011 | Brantweiner et al. |

FOREIGN PATENT DOCUMENTS

| DE | 102005014766 A1 | * | 9/2001 | .......... H01L 41/047 |
| DE | 10343997 A1 | | 4/2005 | |
| DE | 102005014766 A1 | | 9/2006 | |
| DE | 102007042224 A1 | | 3/2009 | |
| DE | 102008050539 A1 | * | 4/2010 | ............... H02N 2/04 |
| DE | 102008050539 A1 | | 4/2010 | |
| EP | 1705722 A2 | | 9/2006 | |
| EP | 2043170 A2 | | 4/2009 | |
| JP | 5-218519 A | | 8/1993 | |
| JP | 5-259526 A | | 10/1993 | |
| JP | 07-079024 | | 3/1995 | |

(Continued)

*Primary Examiner* — Thomas Dougherty
(74) *Attorney, Agent, or Firm* — McDermott Will & Emery LLP

(57) ABSTRACT

A stackable piezoelectric actuator component (100) comprises a stack (10) of piezoelectric layers (11) and electrode layers (12) arranged therebetween, a voltage supply device (20) arranged outside the stack (10) and serving for making electrical contact with the electrode layers, a contact connection (30) for applying a voltage to the voltage supply device (20) and a further contact connection (40), which is electrically coupled to the voltage supply device (20). The contact connection (30) and the further contact connection (40) are designed complementarily with respect to one another in such a way that a further stackable piezoelectric actuator component (200), comprising at least a contact connection or a further contact connection (30, 40), can be electrically coupled to the actuator component (100).

14 Claims, 4 Drawing Sheets

(56) References Cited

FOREIGN PATENT DOCUMENTS

| | | |
|---|---|---|
| JP | 7079025 A | 3/1995 |
| JP | 2007-527972 A | 10/2007 |
| JP | 2012-504858 A | 2/2012 |
| WO | 20051031885 A1 | 4/2005 |
| WO | WO-2005-031885 A1 * | 4/2005 ........... H01L 41/047 |
| WO | WO-2010/040693 A1 | 4/2010 |
| WO | WO-2014-202687 A1 * | 12/2014 ........... H01L 41/083 |

* cited by examiner

STACKABLE PIEZOELECTRIC ACTUATOR COMPONENT

The invention relates to a stackable piezoelectric component which can be coupled to a further stackable piezoelectric component.

A piezoactuator has a multiplicity of piezoelectric layers between which electrode layers are respectively arranged. When an electrical voltage is applied to the electrode layers, the piezoelectric layers expand, as a result of which a stroke is generated. In this case, the expansion of the actuator is linked to the length of the actuator. At a predefined operating voltage, the possible change in length of an actuator is proportional to the length of the actuator. By way of example, 1% to 1.5% of the length of an actuator can be obtained as expansion.

Such piezoactuators are used in diverse areas of application, for example for actuating an injection valve in a motor vehicle. The piezoactuators are generally offered as application-specific products for series applications. A piezoactuator is thus designed by a manufacturer specifically for the later application envisaged on the part of the end customer. Although piezoactuators can be combined in different sizes, in principle, this is usually associated with a considerable outlay in respect of positioning and contact-making.

Figure 1:
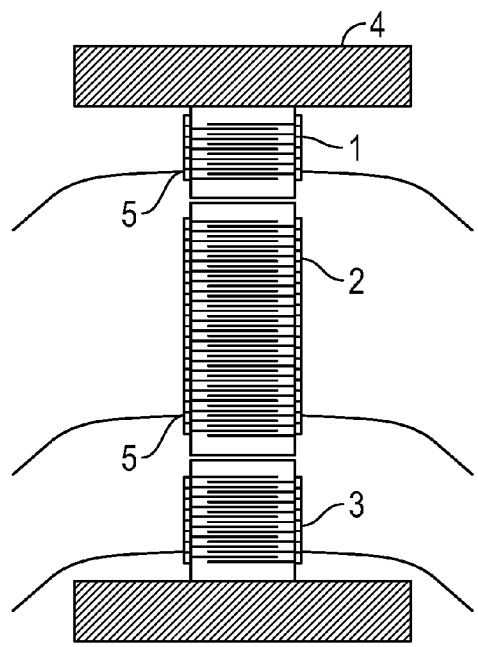

FIG. 1 shows an example of a series connection of three actuators 1, 2 and 3 each having an electrical contact-connection 5, for example a filter external contact-connection. The actuators are clamped in between two receptacles 4. Each actuator is contact-connected via its own electrical connection 5, such that six voltage supply lines are required overall in the example in FIG. 1. This gives rise to a considerable wiring outlay with a corresponding space requirement.

In order to ensure reliable operation, a user who stacks the actuators in the manner shown in FIG. 1 has to position the individual actuators exactly along a force axis. Since the stacked actuators do not form a mechanically stable element among one another and are only fixed by being clamped into the receptacles 4, the positioning of the actuators among one another proves to be difficult.

The object of the present invention is to specify a stackable piezoelectric actuator component which can be combined with further piezoelectric actuator components in a simple manner, thus making possible a stable arrangement of piezoactuators of different sizes.

One embodiment of a stackable piezoelectric actuator component comprises a stack of piezoelectric layers and electrode layers arranged therebetween, a voltage supply device arranged outside the stack and serving for making electrical contact with the electrode layers, a contact connection for applying a voltage to the voltage supply device and a further contact connection, which is electrically coupled to the voltage supply device. The contact connection and the further contact connection are designed complementarily with respect to one another in such a way that a further of the stackable piezoelectric actuator component, comprising at least one of the contact connection and of the further contact connection, can be electrically coupled to the actuator component.

The contacts embodied complementarily with respect to one another make it possible for the actuator component and the further actuator component to be electrically and also mechanically stably coupled to one another. The contact connection of one of the actuator components of the stack forms a common electrical connection contact toward the outside, via which electrical contact can be made with the entire actuator plug connection. Furthermore, the mechanical plug connection of the contact connections and of the complementary contact connections brings about an orientation of the piezoelectric layer arrangements among one another.

The stackable piezoactuators can be produced as standardized piezoactuators (commodity actuators). Such actuators are technically usable universally and can be combined by a user in order to fulfill a wide variety of requirements. By way of example, the individual actuators can have a different length. If the actuators have lengths of 1 cm, 2 cm and 3 cm, a stacked arrangement having virtually any desired length can be constructed through suitable combination of the individual actuators.

Further embodiments of the stackable piezoelectric actuator component can be gathered from the dependent claims.

Figure 2A:
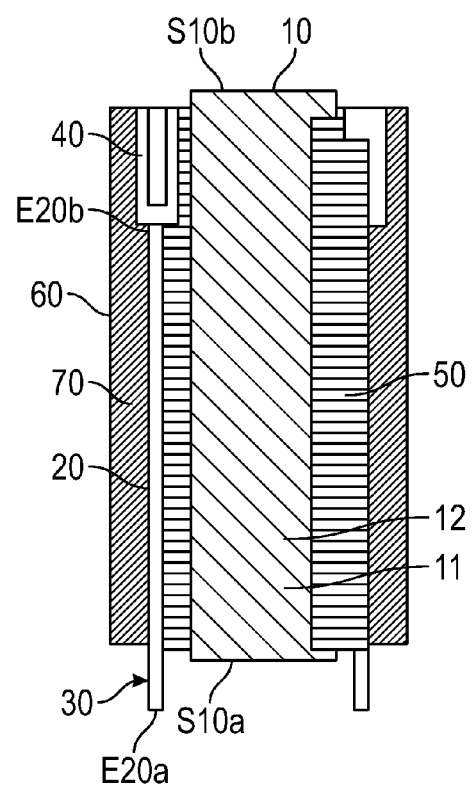
Figure 2B:
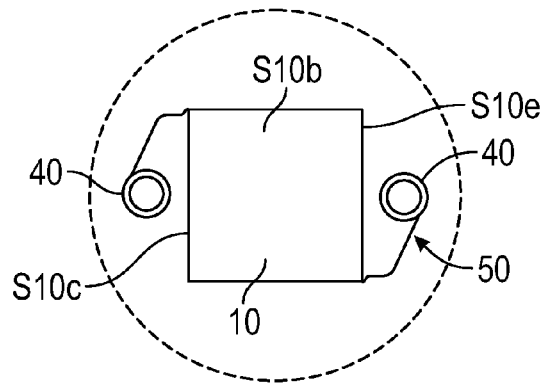
Figure 3A:
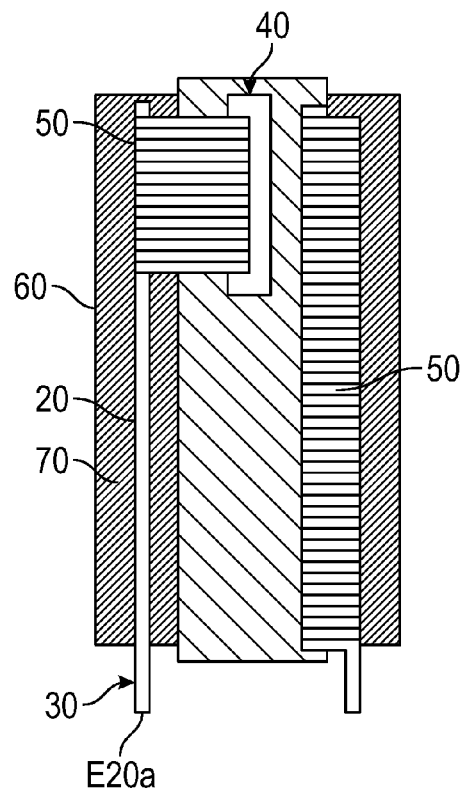
Figure 3B:
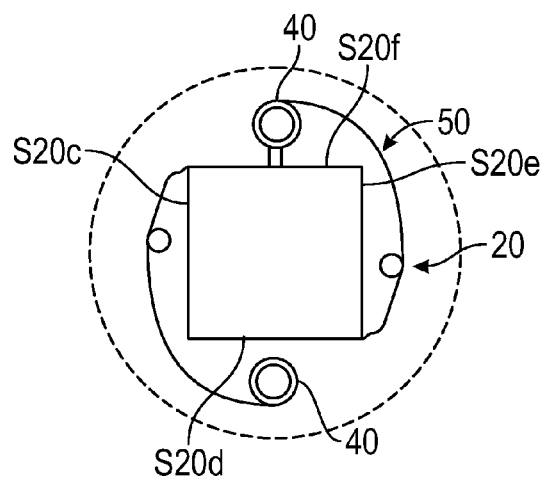
Figure 4A:
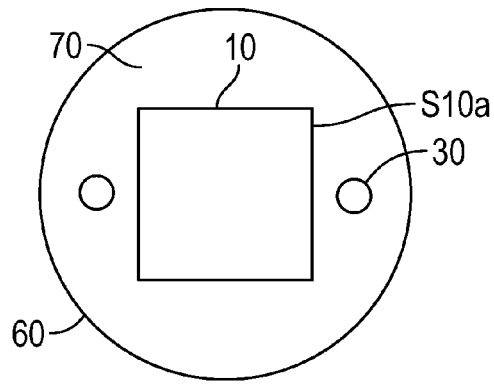
Figure 4B:
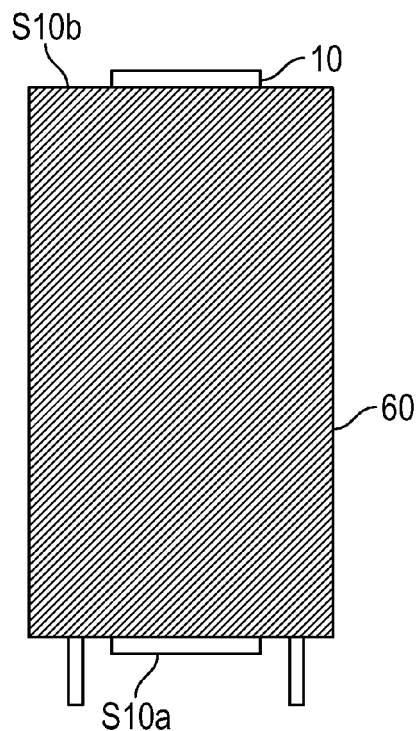
Figure 4C:
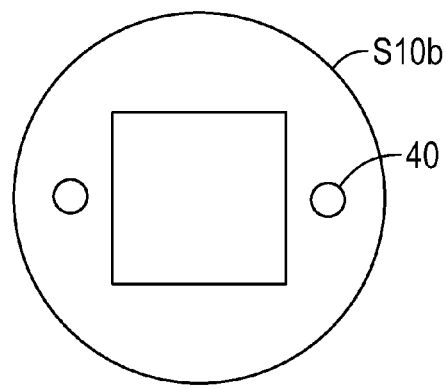
Figure 5:
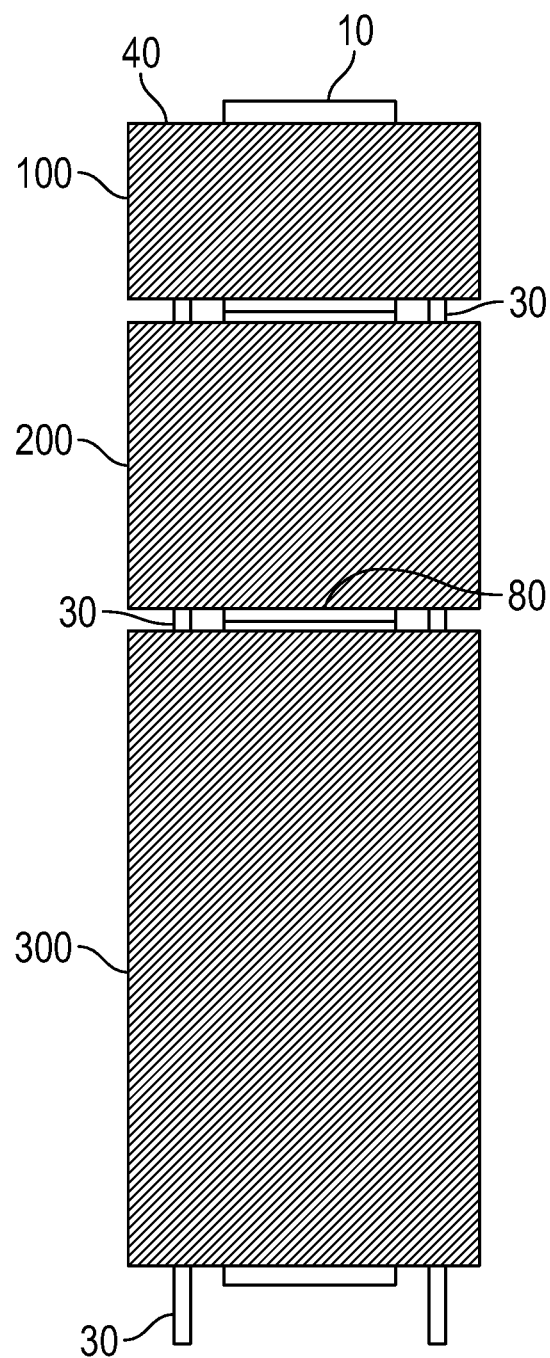

The invention is explained in greater detail below with reference to figures showing exemplary embodiments of the present invention. In the figures:

FIG. 1 shows an embodiment of a series connection of actuators,

FIG. 2A shows one embodiment of a stackable piezoelectric actuator component in a transverse view, FIG. 2B shows one embodiment of a stackable piezoelectric actuator component in a plan view, FIG. 3A shows a further embodiment of a stackable piezoelectric actuator component in a transverse view, FIG. 3B shows a further embodiment of a stackable piezoelectric actuator component in a plan view, FIG. 4A shows an underside of one embodiment of a stackable piezoelectric actuator component and FIG. 4B shows a side view of one embodiment of a stackable piezoelectric actuator component, FIG. 4C shows a top side of one embodiment of a stackable piezoelectric actuator component, FIG. 5 shows a coupling of a plurality of stackable piezoelectric actuator components.

FIG. 2A shows one embodiment of a stackable piezoelectric actuator component in a transverse view. The actuator component comprises a stack 10 of a multiplicity of piezoelectric layers 11 with first and second electrode layers 12 situated therebetween. For operating the actuator component, the first and second electrode layers are connected alternately to external electrodes of different polarities along the stacking direction of the piezoactuator. For this purpose, two voltage supply devices 20 are provided, which are arranged outside the layer stack 10. The voltage supply devices can be designed in each case as a cylindrical contact pin, for example as a coated pin composed of steel, bronze or copper. At least one wire 50 arranged outside the layer stack 10 is provided for feeding the voltage provided by means of the voltage supply devices to the electrode layers 12. Each of the voltage supply devices 20 is connected via at least one wire 50 to the layer stack 10 or to the first or second electrode layers. In the case of the embodiment of the actuator component as shown in FIG. 2A, a plurality of wires 50 are provided, which are arranged in parallel fashion one below another and can be soldered or welded to the voltage supply devices. Along the layer stack 10, the electrode layers 12 are alternately contact-connected to one or the other voltage supply device 20 via in each case at least one wire 50.

The layer stack 10, the voltage supply devices 20 and the at least one wire 50 are surrounded by a housing body 60 for protection. A potting material 70, for example a material composed of silicone, is provided between the housing body 60 and the stack 10 of the piezoelectric layers and the electrode layers. The housing body can be produced from a material composed of plastic, for example composed of PA (polyamide) or a PBT (polybutylene terephthalate). The voltage supply devices 20 and the at least one wire 50 can be arranged between the housing body 60 and the layer stack 10 or embedded into the potting material 70.

In the embodiment of a stackable piezoelectric actuator component as shown in FIG. 2A, the voltage supply devices 20 for making electrical contact with the electrode layers 12 outside the stack 10 respectively run along a side face S10c and a side face S10e opposite the latter of the stack 10 from an end side S10a of the stack to an opposite end side S10b of the stack. The voltage supply devices 20 furthermore have a first end region E20a and E20b wherein the end region E20a is nearer to the end side S10a of the stack than the end region E20b and the end region E20b is arranged nearer to the end side S10b of the stack 10. In order to apply a voltage to the voltage supply devices 20, a respective contact connection 30 is provided for each voltage supply device. Furthermore, contact connections 40 designed complementarily with respect to the contact connection 30 are provided. The contact connections 30 and 40 are thus designed for electrical and/or mechanical coupling to the respective other contact connection.

In the embodiment shown in FIG. 2A, the contact connection 30 is arranged at the first end region E20a of each of the voltage supply devices 20. The contact connection 40 is arranged at the end region E20b of each of the voltage supply devices. The contact connections 30 can be designed for example as an extension of the respective voltage supply devices 20. The contact connection 30 can be designed as a cylindrical contact pin. Complementarily with respect thereto, the contact connection 40 can be designed as a cylindrical hollow body or as a sleeve for receiving the cylindrical contact pin 30.

FIG. 2B shows a plan view of the end side S10b of the embodiment of the stackable piezoelectric actuator component 100 as shown in FIG. 2A. The counter-contact 40, respectively formed at the rear end region E20b of the voltage supply device 20, is connected to the first or second electrode layers of the stack 10 via at least one wire 50.

FIGS. 3A and 3B show a further embodiment of the stackable piezoelectric actuator component. Only the differences with respect to the embodiment presented in FIGS. 2A and 2B will be indicated below.

In the embodiment of a stackable piezoelectric actuator component as illustrated in FIG. 3A, in contrast to the embodiment shown in FIGS. 2A and 2B, the contact connection 40 designed complementarily with respect to the contact connection 30 is not designed as an extension of the voltage supply device 20. Instead, the contact connection 40 is embodied as a component arranged in a manner spatially offset with respect to the voltage supply device 20. The contact connection 30 can furthermore be arranged at the end region E20a of the voltage supply device or can be designed as an extension of the voltage supply device 20.

If the voltage supply device 20 or the contact connection 30 is arranged outside the stack 10 along a side face S20c of the stack 10, the contact connection 40 designed as a contact counterpart can be arranged outside the stack 10 along another side face S20d—different than the side face S20c—of the stack. The side face S20b can be offset by 90° for example with respect to the side face S20c. Consequently, the contact connection 30 and the contact connection 40 are spatially separated or offset by 90° in terms of their respective axis.

In order to connect the contact connection 40 to the voltage supply device 20, at least one wire 50 can be provided. It is also possible, as in the embodiment shown in FIG. 3A, to provide a plurality of wires arranged in parallel fashion for connecting the contact connection 40 to the voltage supply device 20 (wire harp contact-making).

FIG. 3B shows a transverse view of the embodiment of a stackable piezoelectric actuator component as illustrated in FIG. 3A. The stack 10 is embodied in square fashion in cross section. The contact connection 40 is arranged along a section of the side face S20d outside the stack 10 at a distance from said side face. The contact connection 40 is connected to the voltage supply device 20 via at least one wire 50 arranged outside the layer stack. The voltage supply device 20 is in turn connected to the first electrode layers of the piezoelectric stack arrangement via at least one wire arranged outside the stack 10.

The further voltage supply device 20, which is connected to the other electrode layers, runs outside the layer stack 10 along a section of a side face S20e situated opposite the side face S20c. The voltage supply device 20 running along the complete side face S20e of the stack is connected to the second electrode layers via at least one wire 50 and to the further contact connection 40 via a wire 50, said further contact connection being arranged along a section of the side face S20f situated opposite the side face S20d.

The embodiments of a stackable piezoelectric actuator component as shown in FIGS. 2A, 2B, 3A and 3B make possible the electrical and also the mechanical coupling of actuator components. The contact connection 30 has a projection for example relative to the housing body 60. The projection can be between 4 nm and 1.6 cm. The complementary contact connection 40 is designed for receiving the contact connection 40. In particular, the two contact connections are designed in such a way that it is possible to fix one contact connection in the other contact connection. For this purpose, the contact connections can be embodied for example as blade, spring or clamping contacts. In a further possible embodiment, the contact connection 40 can be embodied as a conically extending hollow body. The contact connection 40 thus constitutes a fit into which the contact connection 30 is fixedly held. The contact connection 30 and the contact connection 40 can also be designed in such a way that a positively locking connection is formed when the contact connection 30 is coupled to the contact connection 40.

FIGS. 4A, 4B and 4C illustrate the piezoactuator component shown in FIGS. 2A and 2B in different views. FIG. 4A shows a plan view of an underside of the piezoelectric actuator component. FIG. 4B shows a side view, and FIG. 4C shows a plan view of a top side of the actuator component. At the underside of the piezoelectric actuator component, the contact connections 30 protrude from the potting material 70, such that a projection arises with respect to the housing body 60. With reference to FIG. 4B, it can be discerned that the piezoelectric stack 10 can also protrude from the potting material 70 slightly, although less than the contact connection 30. On the top side of the actuator component, the contact connections 40 are embedded into the potting material 70. The piezoelectric stack protrudes slightly at the top side as well.

A plurality of actuator components of the embodiment shown in FIGS. 2A, 2B and respectively 3A, 3B can be electrically and also mechanically coupled among one another, such that a stacked arrangement of actuators can be constructed from individual actuators.

FIG. 5 shows by way of example an electrical and mechanical plug connection between individual actuators of the embodiment shown in FIGS. 2A and 2B. The contact connections 30 of the piezoelectric actuator component 100 are inserted into the contact connection 40—designed complementarily with respect thereto—of the actuator component 200. The actuator 200 is in turn connected at its underside by its contact connections 30 to the actuator component 300 by means of a plug connection by virtue of the contact connections 30 of the actuator component 200 being coupled to the contact connection 40 of the actuator component 500. If the contact connections 30 are designed as contact pins, the contact connections 40 can be designed as cylindrical hollow bodies, for example, which form a fit with respect to the contact pins 30. For securely fixing the individual actuators, a locking device 80 can be provided at the respective housing bodies, such that the actuator components are oriented and fixed among one another both by means of the contact connections designed complementarily with respect to one another and by means of the respective locking deices.

The contact connections 30 of the actuator component 300 arranged at one side of the plug connection form a common electrical connection contact for operating the stack arrangement. This obviates the need for each actuator component to make contact individually by itself with a voltage supply, such that the wiring outlay can be reduced.

It becomes clear from FIG. 5 that the contact connections 30 and the contact connections 40 of each actuator are arranged in such a way that the piezoelectric stacks of the individual actuator components are oriented in relation to one another. In the embodiment shown in FIG. 5, the contact connections 30 and 40 are arranged, in particular, in such a way that the piezoelectric stacks of the individual actuators are oriented in alignment in relation to one another.

The embodiments of an actuator component as shown provide a passivated and contact-connected piezoactuator at whose end side contacts led toward the outside are arranged and in which matching contact receptacles are provided at the level of the opposite end face. Via these contacts, two or more actuators can be connected to one another in series. Since the contact connections 30 and 40 constitute mutually complementary contacts, the actuators connected to one another have a sufficient stability to ensure that all actuators assembled in this way are contact-connected permanently and reliably during operation as well. The stackable piezoelectric actuator component thus makes it possible for actuators to be interconnected in series in a stack arrangement in a simple manner.

LIST OF REFERENCE SIGNS 1, 2, 3 Actuator component
4 Receptacle
5 Electrical connection
10 Stack
11 Piezoelectric layers
12 Electrode layers
20 Voltage supply device
30 Contact connection
40 Complementary contact connection
50 Wire
60 Housing body
70 Potting material
80 Locking device
100, 200, 500 Actuator components
E End region
S Side/side face

The invention claimed is:

1. A stackable piezoelectric actuator component, comprising:
   a stack of piezoelectric layers and electrode layers arranged therebetween;
   a voltage supply device arranged outside the stack and serving for making electrical contact with the electrode layers;
   a contact connection for applying a voltage to the voltage supply device; and
   a further contact connection, which is electrically coupled to the voltage supply device,
   wherein the contact connection and the further contact connection are designed complementarily with respect to one another in such a way that a further of the stackable piezoelectric actuator component, comprising at least one of the contact connection and of the further contact connection, can be electrically coupled to the actuator component.

2. The stackable piezoelectric actuator component according to claim 1, wherein the contact connection and the further contact connection are designed complementarily with respect to one another in such a way that the further of the actuator component can be mechanically coupled to the actuator component.

3. The stackable piezoelectric actuator component according to claim 1 or 2, wherein the contact connection and the further contact connection are arranged in such a way that upon the coupling of one of the contact connection and of the further contact connection of the actuator component to the at least one of the contact connection of the further contact connection of the further of the actuator component, the stack of the actuator component is oriented in a manner aligned with the stack of the further of the actuator component.

4. The stackable piezoelectric actuator component according to claim 1, wherein the contact connection and the further contact connection are designed in such a way that upon the coupling of one of the contact connection and of the further contact connection of the actuator component to the at least one of the contact connection and of the further contact connection of the further of the actuator component, a positively locking connection is formed between the one of the contact connection and of the further contact connection of the actuator component and the at least one of the contact connection and of the further contact connection of the further actuator component.

5. The stackable piezoelectric actuator component according to claim 1, wherein the contact connection is designed as a cylindrical contact pin, and
   wherein the further contact connection is designed as a hollow cylinder embodied complementarily with respect to the cylindrical contact pin and serving for receiving the cylindrical contact pin.

6. The stackable piezoelectric actuator component according to claim 1, wherein the voltage supply device runs along a side face of the stack from a first side of the stack to a second side of the stack, said second side being situated opposite the first side of the stack, and
   wherein the contact connection is designed as an extension of the voltage supply device.

7. The stackable piezoelectric actuator component according to claim 1, wherein the voltage supply device has a first end region and a second end region,
   wherein the first end region is arranged nearer to the first side of the stack and the second end region is arranged nearer to the second side of the stack, and wherein the contact connection is arranged at the first end region of the voltage supply device and the further contact connection is arranged at the second end region of the voltage supply device.

8. The stackable piezoelectric actuator component according to claim 1, wherein the further contact connection is designed as an extension of the voltage supply device.

9. The stackable piezoelectric actuator component according to claim 1, wherein the further contact connection is arranged in a manner spatially offset with respect to the voltage supply device.

10. The stackable piezoelectric actuator component according to claim 9, wherein the further contact connection is arranged along a different side face than the voltage supply device.

11. The stackable piezoelectric actuator component according to claim 1, wherein the voltage supply device is designed as a cylindrical contact pin.

12. The stackable piezoelectric actuator component according to claim 1, wherein the voltage supply device is connected to the electrode layers of the stack via at least one wire.

13. The stackable piezoelectric actuator component according to claim 1, wherein the further contact connection is connected to the voltage supply device in each case via at least one further wire.

14. The stackable piezoelectric actuator component according to claim 1, wherein the stack is surrounded by a housing body and a potting material is arranged between the stack and the housing body,
wherein the contact connection projects from the housing body, and
wherein the further contact connection is embedded into the potting material.

* * * * *